(12) United States Patent
Suh

(10) Patent No.: US 8,022,400 B2
(45) Date of Patent: Sep. 20, 2011

(54) ORGANIC THIN FILM TRANSISTOR, METHOD OF FABRICATING THE SAME AND ORGANIC LIGHT EMITTING DIODE DISPLAY DEVICE HAVING THE SAME

(75) Inventor: Min-Chul Suh, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 182 days.

(21) Appl. No.: 12/477,018

(22) Filed: Jun. 2, 2009

(65) Prior Publication Data

US 2009/0302312 A1    Dec. 10, 2009

(30) Foreign Application Priority Data

Jun. 5, 2008  (KR) .................. 10-2008-0053338

(51) Int. Cl.
    H01L 29/08      (2006.01)
    H01L 51/40      (2006.01)
(52) U.S. Cl. ......................... 257/40; 438/99
(58) Field of Classification Search ............ 257/40, 257/59, 72, 347, 350; 438/99, 158, 159
    See application file for complete search history.

(56) References Cited

U.S. PATENT DOCUMENTS

| 4,684,435 | A  | * | 8/1987  | Kishi et al. ............. 438/158 |
| 5,998,085 | A  |   | 12/1999 | Isberg et al. |
| 7,045,469 | B2 |   | 5/2006  | Sohn et al. |
| 7,585,697 | B2 | * | 9/2009  | Moriya .................. 438/99 |

FOREIGN PATENT DOCUMENTS

| KR | 10-2004-0032401 | 4/2004 |
| KR | 10-2004-0061795 | 7/2004 |
| KR | 10-2005-0022554 | 3/2005 |
| KR | 10-0620141      | 9/2006 |

* cited by examiner

*Primary Examiner* — Mark Prenty
(74) *Attorney, Agent, or Firm* — Christie, Parker & Hale, LLP

(57) ABSTRACT

An organic thin film transistor, a method of fabricating the same, and an organic light emitting diode (OLED) display device having the same. The organic thin film transistor includes a substrate, a buffer layer disposed on the substrate, a gate electrode disposed on the buffer layer, a gate insulating layer disposed on the gate electrode, an organic semiconductor layer disposed on the gate insulating layer, source and drain electrodes disposed on the gate insulating layer and electrically connected with the organic semiconductor layer, and a passivation layer formed of a polymer composite and disposed on the organic semiconductor layer.

20 Claims, 5 Drawing Sheets

ORGANIC THIN FILM TRANSISTOR, METHOD OF FABRICATING THE SAME AND ORGANIC LIGHT EMITTING DIODE DISPLAY DEVICE HAVING THE SAME

CROSS-REFERENCE TO RELATED APPLICATION

This application claims priority to and the benefit of Korean Patent Application No. 10-2008-53338, filed Jun. 5, 2008, the entire content of which is incorporated herein by reference.

BACKGROUND OF THE INVENTION

1. Field of the Invention

The present invention relates to an organic thin film transistor, a method of fabricating the same, and an organic light emitting diode (OLED) display device having the same.

2. Description of the Related Art

A conventional silicon thin film transistor includes a semiconductor layer having source and drain regions doped with high-concentration impurities, and a channel region formed between the two regions, a source electrode connected with the source region, and a drain electrode connected with a drain region.

Such a silicon thin film transistor has a high production cost, and is vulnerable to external impact. In addition, since it is fabricated at a high temperature, it cannot be formed on a plastic substrate used for giving flexibility to a device.

Meanwhile, an organic thin film transistor (OTFT) using an organic semiconductor layer formed of an organic material can be formed on a plastic substrate because it can be fabricated at room temperature, unlike the conventional silicon thin film transistor. Accordingly, such an organic thin film transistor can be employed in the applications such as flexible display devices, smart cards, inventory or price displayers, etc.

However, the organic semiconductor layer is easily damaged by oxygen or heat. For this reason, when an organic layer is formed on the organic semiconductor layer by deposition, the organic semiconductor layer can be damaged by heat, which has a detrimental effect on the device's characteristics.

SUMMARY OF THE INVENTION

Aspects of embodiments of the present invention are directed toward an organic thin film transistor, a method of fabricating the same, and an organic light emitting diode (OLED) display device having the same, which are provided to reduce (or protect from) a degradation of device characteristics caused by the damage to an organic semiconductor layer, which is vulnerable to heat, during a film formation process performed at high temperature.

Another aspect of an embodiment of the present invention is directed toward a method of forming a passivation layer to protect an organic semiconductor layer in a fabrication process.

According to an embodiment of the present invention, an organic thin film transistor includes: a substrate; a buffer layer disposed on the substrate; a gate electrode disposed on the buffer layer; a gate insulating layer disposed on the gate electrode; an organic semiconductor layer disposed on the gate insulating layer; a source electrode and a drain electrode disposed on the gate insulating layer, and electrically connected with the organic semiconductor layer; and a passivation layer formed of a polymer composite and disposed on the organic semiconductor layer.

According to another embodiment of the present invention, a method of fabricating an organic thin film transistor is provided. The method includes: forming a substrate; forming a buffer layer on the substrate; forming a gate electrode on the buffer layer; forming a gate insulating layer on the gate electrode; forming a source electrode and a drain electrode on the gate insulating layer; forming an organic semiconductor layer on the source and drain electrodes to correspond in position to the gate electrode; and forming a passivation layer on the organic semiconductor layer, the passivation layer being formed of a composite including a polymer.

According to another embodiment of the present invention, an organic light emitting diode (OLED) display device includes: a substrate; a buffer layer on the substrate; a gate electrode on the buffer layer; a gate insulating layer on the gate electrode; an organic semiconductor layer on the gate insulating layer; a source electrode and a drain electrode on the gate insulating layer, and electrically connected with the organic semiconductor layer; a passivation layer including a polymer composite and on the organic semiconductor layer; a first electrode on the passivation layer and electrically connected with at least one of the source electrode or the drain electrode; an organic layer including an organic emission layer and on the first electrode; and a second electrode on the organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
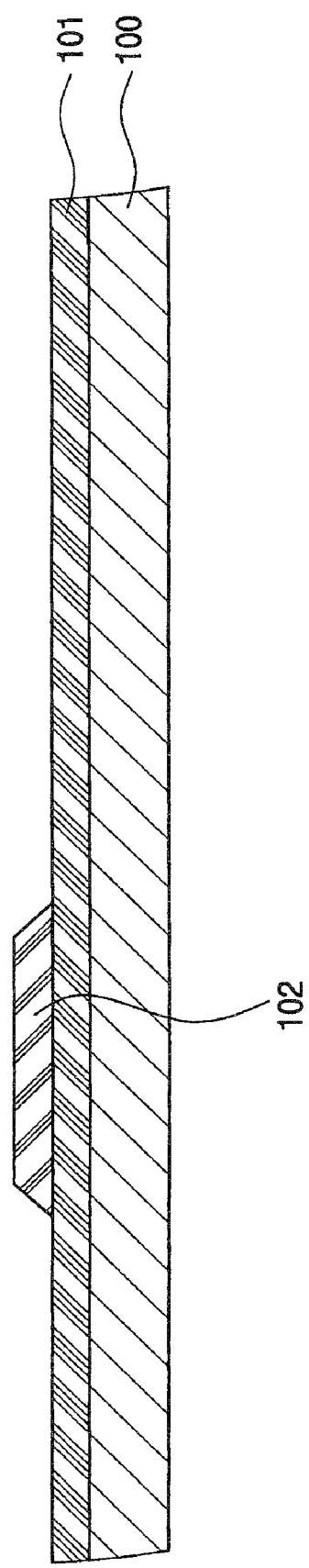
FIGS. 1A to 1D are cross-sectional schematic views of an organic thin film transistor according to an exemplary embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIGS. 1A to 1D are cross-sectional schematic views of an organic thin film transistor according to an exemplary embodiment of the present invention.

Referring to FIG. 1A, a substrate 100 is provided, and a buffer layer 101 is formed to prevent (or protect from) out-diffusion of impurities from the substrate 100. The substrate 100 may be formed of glass, silicon, plastic and/or metal. Here, the plastic, which can be utilized to form the substrate 100, includes polyethylene terephthalate (PET), polyethylene naphthalate (PEN), polyether sulfone (PES), polyether imide, polyphenylene sulfide (PPS), polyarylate, polyimide, polycarbonate (PC), cellulose triacetate, and/or cellulose acetate propionate (CAP).

Then, a gate electrode 102 is formed on the buffer layer 101 and then patterned. The gate electrode 102 may be formed of a conductive metal, e.g., molybdenum-tungsten (MoW), aluminum (Al), chromium (Cr), or Al/Cr, and/or a conductive polymer.

Figure 1B:
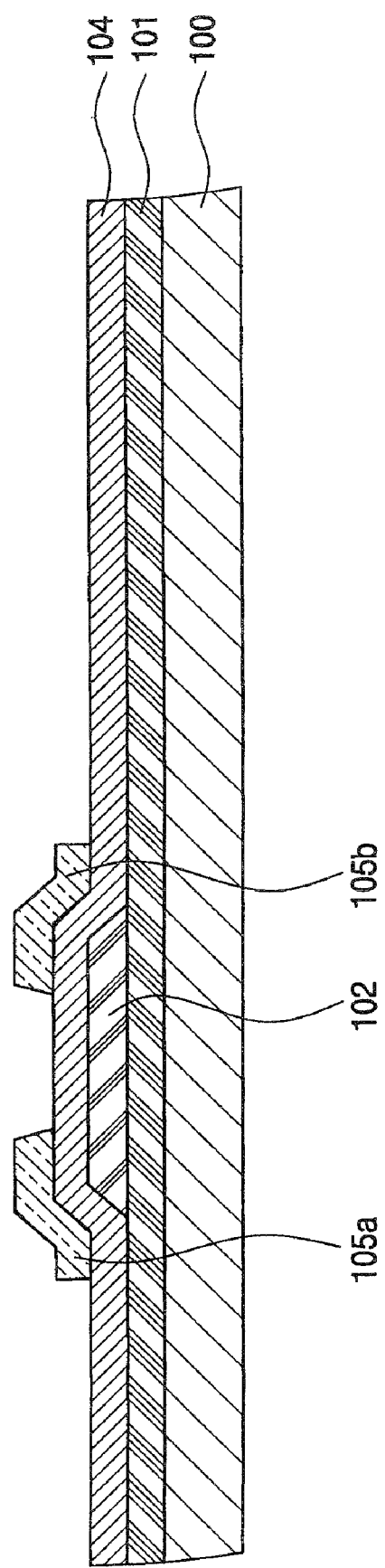

Referring to FIG. 1B, a gate insulating layer 104 is then formed on the entire surface of the substrate 100. The gate insulating layer 104 may be formed of benzocyclobutene (BCB), polyimide, polyvinylphenol, parylene, epoxy, and/or polyvinylchloride.

After that, source and drain electrodes 105a and 105b are formed on the gate electrode 102 to correspond in positions to both ends of the gate electrode 102, other than the middle thereof. The source and drain electrodes 105a and 105b may be formed of Mo, Cr, W, aluminum-neodymium (Al—Nd), titanium (Ti), MoW and/or Al.

Figure 1C:
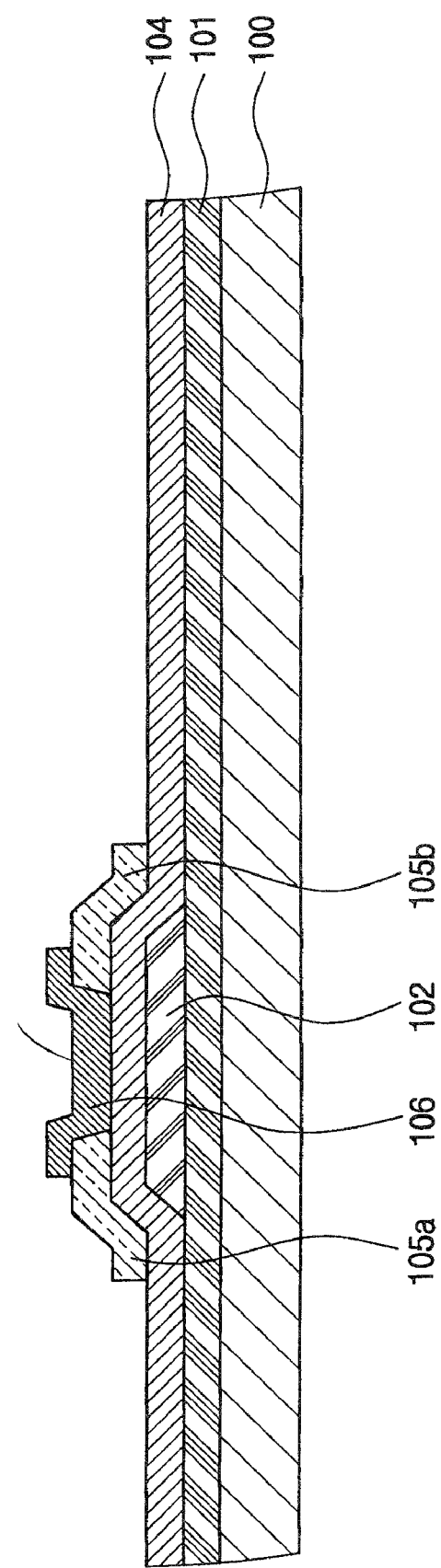

Referring to FIG. 1C, an organic semiconductor layer 106 is formed on the source and drain electrodes 105a and 105b to correspond in position to the gate electrode 102. Since the organic semiconductor layer 106 is a region where a channel is formed, when a plurality of organic thin film transistors are disposed, the organic semiconductor layer is patterned as a unit of an organic thin film transistor to prevent (or protect from) cross-talk between the adjacent thin film transistors. That is, the organic semiconductor layer 106 is insulated from the adjacent organic semiconductor layer.

The organic semiconductor layer 106 may be formed of pentacene, tetracene, anthracene, naphthalene, fullerene, α-6-thiophene, α-4-thiophene, oligo thiophene, perylene and/or its derivatives, rubrene and/or its derivatives, coronene and/or its derivatives, perylenetetracarboxylic diimide and/or its derivatives, perylenetetracarboxylic dianhydride and/or its derivatives, polythiophene and/or its derivatives, polyparaphenylenevinylene and/or its derivatives, polyparaphenylene and/or its derivatives, polyfluorene and/or its derivatives, polythiophenevinylene and/or its derivatives, polythiophene-heterocyclic aromatic copolymer and/or its derivatives, oligoacene of naphthalene and/or its derivatives, naphthalenetetracarboxylic diimide and/or its derivatives, oligo thiophene from α-5-thiophene and/or its derivatives, phthalocyanine (with and/or without metal) and/or its derivatives, pyromellitic dianhydride and/or its derivatives, pyromellitic diimide and/or its derivatives, polyalkylthiophene, polythienylenevinylene, alkylfluorene unit, alkylthiophene, and/or copolymers thereof.

Figure 1D:
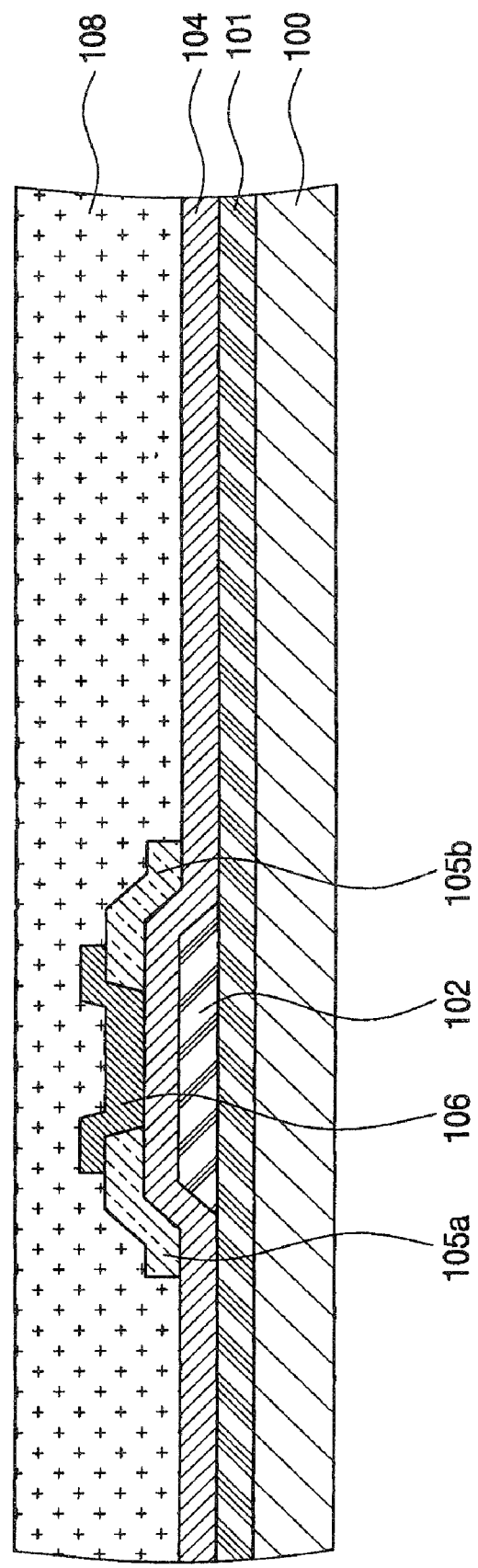

Referring to FIG. 1D, a passivation layer 108 is formed on the entire surface of the substrate 100 having the organic semiconductor layer 106.

The passivation layer 108 is formed of a polymer composite on the substrate using laser induced thermal imaging. The passivation layer 108 may be formed of a polymer composite including several polymer materials or a polymer material and a small molecule material. In one embodiment, the polymer composite has to include a polymer material.

The reason that the passivation layer 108 according to an embodiment of the present invention has to be a composite layer including a polymer is because coherence of a material for a transfer layer has to have an appropriate value for smooth performance of the laser induced thermal imaging technique. Thus, a mixture enhances transferring. Here, the passivation layer 108 has to contain a polymer material. When the passivation layer is formed of only a small molecule material, it exhibits a good transfer characteristic, but cannot be uniformly formed due to small coherence, thus being difficult to protect a semiconductor layer. For this reason, the passivation layer 108 according to an embodiment of the present invention has to be formed of a composite having a polymer material with good coherence for protecting the semiconductor layer. Thus, the composite may include a mixture of a polymer and another polymer, or a mixture of the polymer binder material and a small molecule having many benzene rings.

The polymer composite includes a polymer binder material or a photoresist material, which is used in a color filter. Here, the polymer binder material may include acrylic resin, epoxy resin or alkyd resin, having a molecular weight of 1500 to 10000. In one embodiment, when the molecular weight is less than 1500, the polymer binder material is deteriorated in its protection ability for an organic semiconductor. In another embodiment, when the molecular weight is more than 10000, the polymer binder material is significantly deteriorated in laser induced thermal imaging characteristics.

The photoresist material may include PEDOT, PANI, and/or a general polymer material such as polystyrene or PMMA.

The passivation layer 108 is formed to a thickness of 100 to 10000 nm. The passivation layer 108 may be formed to a thickness of 100 nm or more to protect the device, and may be formed to a thickness of 10000 nm or less to form a thin film device.

In the laser induced thermal imaging technique for forming the passivation layer 108, a passivation starting layer is formed on a base film having a light-to-heat conversion layer by a suitable method, and then the passivation layer 108 is formed on a substrate utilizing laser. The laser induced thermal imaging technique is performed at low temperature, so that the technique can reduce damage to an organic semiconductor layer, which is vulnerable to heat, during the formation process of the passivation layer 108.

According to the present embodiment as described above with reference to FIGS. 1A to 1D, an organic thin film transistor can be realized with reduced damages.

Also, while the thin film transistor has an organic semiconductor layer, which is disposed over source and drain electrodes in the present embodiment as described above with reference to FIGS. 1A to 1D, the present invention is not thereby limited. That is, in an alternative embodiment, a thin film transistor has an organic semiconductor layer disposed under its source and drain electrodes, and/or has an ohmic contact layer between the organic semiconductor layer and the source and drain electrodes.

Figure 2:
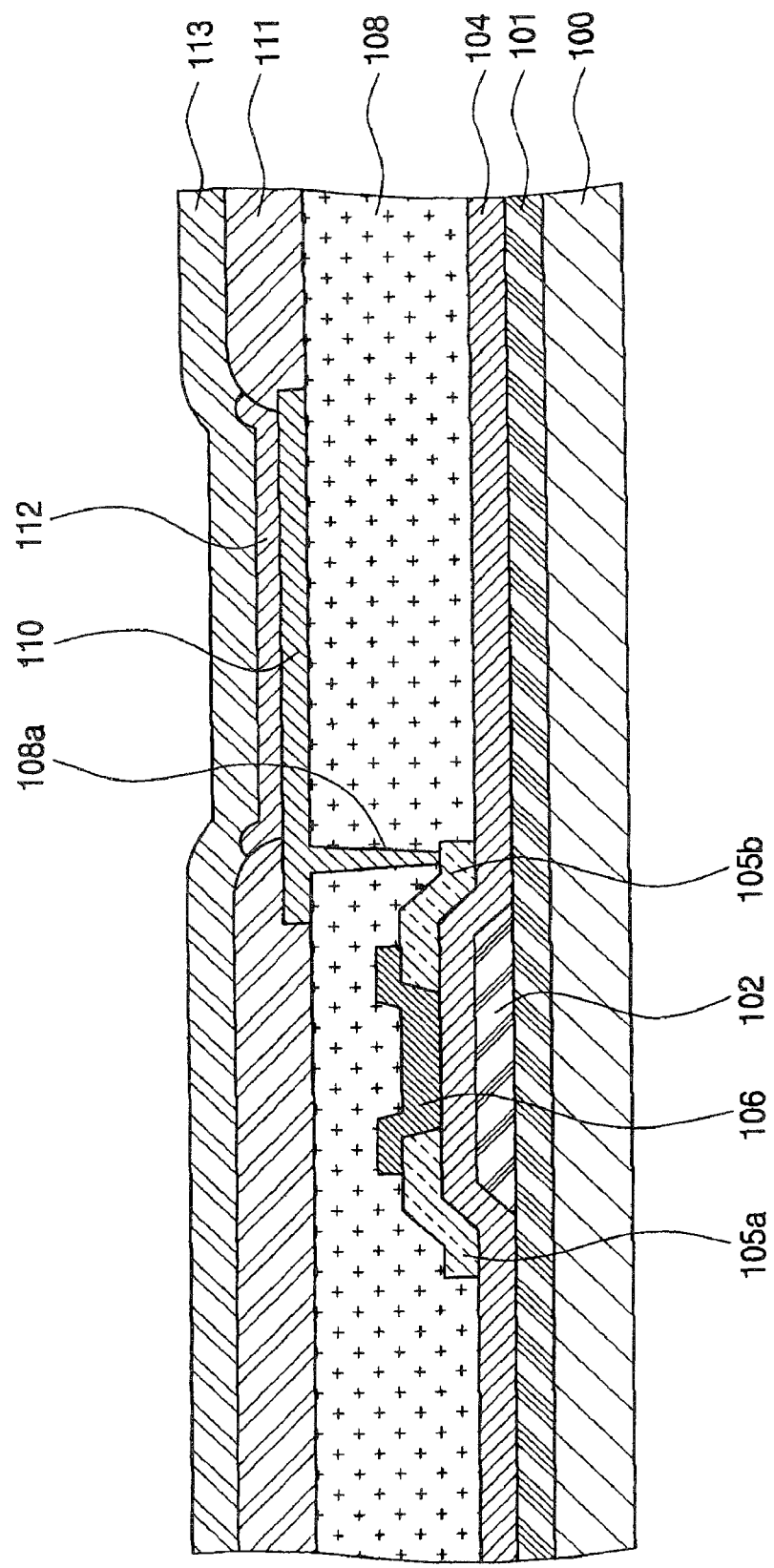
FIG. 2 is a cross-sectional schematic view of an organic light emitting diode display device according to an exemplary embodiment of the present invention.

FIG. 2 is a cross-sectional view of an organic light emitting diode (OLED) display device according to an exemplary embodiment of the present invention.

The OLED display device includes the organic thin film transistor, and thus the materials for respective components of the thin film transistor are the same (or substantially the same) as those described above with reference to FIGS. 1A to 1D, and will not be described again in more detail.

Referring to FIG. 2, after the thin film transistor is completed, a first electrode 110 is formed, which is connected with at least one of the source and drain electrodes 105a and 105b through a via hole 108a formed in the passivation layer 108. The first electrode 110 may be a transparent or reflective electrode. When the first electrode 110 is a transparent electrode, it may be formed of ITO, IZO, ZnO and/or $In_2O_3$. When the first electrode 110 is a reflective electrode, it may be formed in a multilayer structure having a first layer formed of Ag, Mg, Al, Pt, Pd, Au, Ni, Nd, Ir, and/or Cr, and a second layer formed of ITO, IZO, ZnO and/or $In_2O_3$ on the first layer.

After that, a pixel defining layer 111 for defining a pixel is formed on the first electrode 110, and then an organic layer 112 having an organic emission layer is formed. Then, a second electrode 113 is formed on the entire surface of the substrate 100.

Here, the second electrode 113 may be also formed as a transparent or reflective electrode. When the second electrode 113 is formed as a transparent electrode, it may be formed in a multilayer structure having a first layer formed of Li, Ca, LiF/Ca, LiF/Al, Al, and/or Mg, and a second layer formed of ITO, IZO, ZnO and/or $In_2O_3$ on the first layer. Here, the second layer may be formed as an auxiliary electrode or a bus electrode line.

Alternatively, when the second electrode 113 is formed as a reflective electrode, it is formed of Li, Ca, LiF/Ca, LiF/Al, Al, and/or Mg on the entire surface of the substrate 100 by deposition.

The organic layer 112 disposed between the first electrode 110 and the second electrode 113 may include a small molecule organic material or a polymer organic material.

When the organic layer 112 includes a small molecule organic material, the organic layer 112 may include at least one of a hole injection layer, a hole transport layer, an organic emission layer, an electron transport layer or an electron injection layer.

Here, the small molecule organic material may include copper phthalocyanine (CuPc), N,N'-di(naphthalene-1-yl)-N,N'-diphenyl-benzidine (NPB), and/or or tris-8-hydroxy-lquinoline aluminum (Alq3), and the small molecule organic material may be vacuum-deposited by utilizing a mask.

When the organic layer 112 includes a polymer organic material, the layer can have a hole transport layer and an emission layer. Here, the hole transport layer may include polyethylene dioxythiophene, and the emission layer may include a poly-phenylenevinylene(PPV)-and/or polyfluorene-based material.

The organic thin film transistors can be fabricated to be flexible, and thus the OLED display device having the organic thin film transistors can have flexibility.

In view of the foregoing, embodiments of the present invention provide an organic thin film transistor, a method of fabricating the same, and an OLED display device having the same, in which a layer formation process is performed on an organic semiconductor layer (e.g., a conventional organic semiconductor layer), which is vulnerable to heat, by utilizing laser induced thermal imaging at low temperature. As such, damage to the organic semiconductor layer can be reduced and characteristics of the device can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic thin film transistor, comprising:
   a substrate;
   a buffer layer on the substrate;
   a gate electrode on the buffer layer;
   a gate insulating layer on the gate electrode;
   an organic semiconductor layer on the gate insulating layer;
   a source electrode and a drain electrode on the gate insulating layer, and electrically connected with the organic semiconductor layer; and
   a passivation layer comprising a polymer composite and on the organic semiconductor layer,
   wherein the polymer composite comprises a polymer binder material, and
   wherein the polymer binder material comprises at least one of acrylic resin, epoxy resin or alkyd resin.

2. An organic thin film transistor, comprising:
   a substrate;
   a buffer layer on the substrate;
   a gate electrode on the buffer layer;
   a gate insulating layer on the gate electrode;
   an organic semiconductor layer on the gate insulating layer;
   a source electrode and a drain electrode on the gate insulating layer, and electrically connected with the organic semiconductor layer; and
   a passivation layer comprising a polymer composite and on the organic semiconductor layer,
   wherein the polymer composite comprises a photoresist material.

3. An organic thin film transistor, comprising:
   a substrate;
   a buffer layer on the substrate;
   a gate electrode on the buffer layer;
   a gate insulating layer on the gate electrode;
   an organic semiconductor layer on the gate insulating layer;
   a source electrode and a drain electrode on the gate insulating layer, and electrically connected with the organic semiconductor layer; and
   a passivation layer comprising a polymer composite and on the organic semiconductor layer,
   wherein the polymer composite comprises a small molecule material having a benzene ring.

4. A method of fabricating an organic thin film transistor, the method comprising:
   forming a substrate;
   forming a buffer layer on the substrate;
   forming a gate electrode on the buffer layer;
   forming a gate insulating layer on the gate electrode;
   forming a source electrode and a drain electrode on the gate insulating layer;
   forming an organic semiconductor layer on the source and drain electrodes to correspond in position to the gate electrode; and
   forming a passivation layer on the organic semiconductor layer, the passivation layer being formed of a composite comprising a polymer,
   wherein the passivation layer is formed by utilizing laser induced thermal imaging.

5. An organic light emitting diode (OLED) display device, comprising:
   a substrate;
   a buffer layer on the substrate;
   a gate electrode on the buffer layer;
   a gate insulating layer on the gate electrode;
   an organic semiconductor layer on the gate insulating layer;
   a source electrode and a drain electrode on the gate insulating layer, and electrically connected with the organic semiconductor layer;
   a passivation layer comprising a polymer composite and on the organic semiconductor layer;
   a first electrode on the passivation layer and electrically connected with at least one of the source electrode or the drain electrode;
   an organic layer comprising an organic emission layer and on the first electrode; and
   a second electrode on the organic layer.

6. The organic thin film transistor according to claim 1, wherein the passivation layer has a thickness of about 100 to about 10000 nm.

7. The organic thin film transistor according to claim 1, further comprising:
an ohmic contact layer between the organic semiconductor layer and the source and drain electrodes.

8. The method according to claim 4, wherein the passivation layer is formed of a polymer composite having a polymer binder material.

9. The method according to claim 4, wherein the passivation layer is formed of a polymer composite having a photoresist material.

10. The method according to claim 4, wherein the passivation layer is formed of a polymer composite comprising a small molecule material having a benzene ring.

11. The OLED display device according to claim 5, wherein the polymer composite comprises a polymer binder material.

12. The OLED display device according to claim 11, wherein the polymer binder material comprises at least one of acrylic resin, epoxy resin or alkyd resin.

13. The OLED display device according to claim 5, wherein the polymer composite comprises a photoresist material.

14. The OLED display device according to claim 5, wherein the polymer composite comprises a small molecule material having a benzene ring.

15. The OLED display device according to claim 5, wherein the passivation layer has a thickness of about 100 to about 10000 nm.

16. The OLED display device according to claim 5, further comprising:
an ohmic contact layer between the organic semiconductor layer and the source and drain electrodes.

17. The organic thin film transistor according to claim 2, wherein the passivation layer has a thickness of about 100 to about 10000 nm.

18. The organic thin film transistor according to claim 2, further comprising:
an ohmic contact layer between the organic semiconductor layer and the source and drain electrodes.

19. The organic thin film transistor according to claim 3, wherein the passivation layer has a thickness of about 100 to about 10000 nm.

20. The organic thin film transistor according to claim 3, further comprising:
an ohmic contact layer between the organic semiconductor layer and the source and drain electrodes.

* * * * *